United States Patent
Akimitsu et al.

(10) Patent No.: US 6,956,011 B2
(45) Date of Patent: Oct. 18, 2005

(54) INTERMETALLIC COMPOUND SUPERCONDUCTORS AND ALLOY SUPERCONDUCTORS, AND METHOD FOR THEIR PREPARATION

(75) Inventors: Jun Akimitsu, 6-2-3 Himonya, Meguro-ku, Tokyo 152-0003 (JP); Yuji Zenitani, Tokyo (JP); Takahiro Muranaka, Tokyo (JP); Norimasa Nakagawa, Tokyo (JP); Jun Nagamatsu, Tokyo (JP)

(73) Assignees: Japan Science and Technology Agency, Saitama (JP); Jun Akimitsu, Tokyo (JP)

(*) Notice: Subject to any disclaimer, the term of this patent is extended or adjusted under 35 U.S.C. 154(b) by 272 days.

(21) Appl. No.: 10/220,272
(22) PCT Filed: Jul. 24, 2001
(86) PCT No.: PCT/JP01/06383
§ 371 (c)(1),
(2), (4) Date: Sep. 9, 2002
(87) PCT Pub. No.: WO02/055435
PCT Pub. Date: Jul. 18, 2002

(65) Prior Publication Data
US 2003/0017949 A1 Jan. 23, 2003

(30) Foreign Application Priority Data
Jan. 9, 2001 (JP) ........................................ 2001-001948

(51) Int. Cl.$^7$ .......................... H01B 12/00; H01L 39/12; C04B 101/00
(52) U.S. Cl. ....................... 505/100; 505/805; 420/402; 420/901
(58) Field of Search .................................. 505/100, 452, 505/500, 805; 423/289; 420/402, 901

(56) References Cited

PUBLICATIONS

"The preparation of aluminum diboride, AIB2" Felten, Edward J. et al Journal of the American Chemical Society (1956), 78, 5977–78.*

Preparation and structure of magnesium boride, MgB2 Jones, Morton E. et al Journal of the American Chemical Society (1954), 76, 1434–6 (Abstract Only).*

(Continued)

*Primary Examiner*—Mark Kopec
(74) *Attorney, Agent, or Firm*—Westerman, Hattori, Daniels & Adrian, LLP

(57) ABSTRACT

There are provided an intermetallic compound superconductor that is high in superconducting transition temperature, and an alloy superconductor that is high in superconducting transition temperature and excels in malleability and ductility, as well as a method of making such a superconductor with good reproducibility and at a low cost of manufacture. This entirely new intermetallic compound superconductor is made of magnesium (Mg) and boron (B) and has a chemical composition expressed by formula: $Mg_1B_2$, has a hexagonal $AlB_2$ type crystallographic structure and has a superconducting transition temperature ($T_c$) of 39 K. An alloy containing this intermetallic compound excels in malleability and ductility and constitutes the alloy superconductor having a superconducting transition temperature ($T_c$) of 39 K. In the method of manufacture, a Mg containing feedstock powder and a B containing feedstock powder are mixed together to form a mixture thereof which is, e.g., hot pressed to produce a semiconductor product.

9 Claims, 9 Drawing Sheets

PUBLICATIONS

Chretein et al "Magnesium boride: its thermal reactions"; Compt. Rend. (1962), 254, 1439–41. (Abstract only).*

Naslain et al "Magnesium diborides and tetraborides"; Journal of Solid State Chem. (1973), 8(1), 68–85 (Abstract only).*

Jun Nagamatsu et al.; Letters to Nature; vol. 410, pp. 63–64; Mar. 1, 2001. See PCT search report.

D. C. Larhalestler et al., Letters to Nature; vol. 410, pp. 186–189; Mar. 8, 2001. See PCT search report.

A. V. Tsvyashchenko et al.; vol. 119, No. 3, pp. 153–158, Jul. 17, 2001. See PCT search report.

Leyarovska, et al, Search for Superconductivity Below 1K in Transition Metal Borides; Journal of the Less–Common Metals, 67 (1979) p. 249–255.

* cited by examiner

FIG. 4

| Atomic Coordinates | X | Y | Z |
|---|---|---|---|
| Mg | 0.0000 | 0.0000 | 0.0000 |
| B | 0.3333 | 0.6666 | 0.5000 |

INTERMETALLIC COMPOUND SUPERCONDUCTORS AND ALLOY SUPERCONDUCTORS, AND METHOD FOR THEIR PREPARATION

TECHNICAL FIELD

This present invention relates to an intermetallic superconductor and an alloy superconductor which can be utilized in superconducting electronics such as a large scale electric power transmission system, a superconductive power storage system, a high performance Josephson device and a high frequency or electronic device, and which especially are high in superconducting transition temperature, are easy to manufacture, excel in malleability and ductility, and yet are altogether new. The invention also relates to a method of making such a novel superconductor.

BACKGROUND ART

Superconductors are known to include a superconductor made of a simple metal, a superconductor made of a compound, and a superconductor made of composite oxides.

A simple metal superconductor may contain a simple metal such Pb and Nb but is known to lack utility because it is low in superconducting transition temperature.

Known as intermetallic compound superconductors include those having a A15 type crystallographic structure of intermetallic compounds as represented by $Nb_3Ge$, $Nb_3Ga$, $Nb_3Al$ and $Nb_3Sn$, and those having a chevrel type crystallographic structure of intermetallic compounds as represented by $PbMo_6S_8$. Intermetallic compound superconductors having an $AlB_2$ type crystallographic structure of intermetallic compounds as represented by $NbB_2$ are also known which, however, are also known to be extremely low in superconducting transition temperature ($T_c$=0.62 K, see Journal of the Less-Common Metals, 67 (1979), 249–255). These intermetallic compound superconductors include one with $Nb_3Ge$ which is relatively high in superconducting transition temperature (=about 23 K), but commonly have the disadvantage that they are weak in distortion and are fragile.

Known as a composite oxide superconductor include La group oxide superconductors as represented by composition $La_{2-x}Ba_xCuO_4$, Y group oxide superconductors as represented by composition $Y_1Ba_2Cu_3O_{7-x}$, Bi group oxide superconductors as represented by composition $Bi_2Sr_2Ca_{n-1}Cu_nO_{2n+2}$, Tl group superconductors as represented by composition $Tl_2Ba_2Ca_{n-1}Cu_nO_{2n+2}$, and Hg group oxide superconductors as represented by $Hg_1Ba_1CaCu_1O_{6+x}$. These composite oxide superconductors are high in superconducting transition temperature and indeed include those which have their superconducting transition temperatures reaching as high as 150 K. The composite oxide superconductor has a perovskite structure made up of a lamination of an octahedral, pyramidal or planar superconducting layer of $CuO_2$, and a block layer (dissimilar in crystallographic structure to the superconducting layer) made of an atom or atoms such as La, Ca, Y, Bi or Hg and oxygen. As such the extreme complexity of the crystallographic structure of a composite oxide superconductor makes it difficult to conduct its production in a large volume and with good reproducibly. In addition, the superconductor being a composite oxide is naturally poor in both malleability and ductility, and is hard to use as a superconducting electric cable or wire.

A well known alloy superconductor is a Nb—Ti alloy, which is excellent in malleability and ductility and hence has been used to form superconducting electric cables or wires and superconducting magnets. However, an alloy conductor is as low in superconducting transition temperature as, e.g., about 9 K with the Nb—Ti alloy, and hence improvements in them are being sought.

It is accordingly an object of the present invention to provide an intermetallic compound that is high in superconducting transition temperature. It is also an object of the present invention to provide an alloy superconductor that is high in superconducting transition temperature and also excels in malleability and ductility. It is further an object of the present invention to provide methods of making them reproducibly and at a relative low cost of manufacture.

DISCLOSURE OF THE INVENTION

First, it is summarily stated how the inventors arrived at the present invention. It is generally thought that a superconductor made to contain a light element has its superconducting transition temperature raised. It was forecast that boron which is a light element and whose crystal is a semiconductor may be combined with another or other elements to develop superconductivity with a high probability. While among compounds of various transition metallic elements with boron, $TiB_2$ taking the $AlB_2$ crystallographic structure was found to be extremely low in electrical resistance, it did not exhibit superconductivity. After various three-element combinations were tried, it was confirmed that a combination of magnesium, a transition metal and boron developed a superconductivity which was, however, extremely low. Then, a trial of composing these elements in various altered proportions revealed that a stronger superconductivity is obtainable with a compound of magnesium and boron without containing a transition metallic element. However, since compounds were initially tested which contained magnesium much larger in amount than boron, powder X-ray diffraction measurements made observable only diffraction lines based on the crystallographic structure of the magnesium crystal, leading to the assumption that the genesis of the superconductivity might be an alloy in which boron is solid-dissolved into magnesium. Then, however, experiments conducted while varying the proportions of magnesium and boron little by little have finally revealed that the intermetallic compound of MgB exhibits a very high superconducting transition temperature at composition proportions of $Mg_1B_2$ where a strong superconductivity is also observed. Upon the confirmation that this is the essential of the superconduction, the present invention has been arrived at.

Accordingly, the first object mentioned above is attained in accordance with the present invention by an intermetallic compound superconductor characterized in that it is made of magnesium (Mg) and boron (B).

The second object mentioned above is attained in accordance with the present invention by an alloy superconductor characterized in that it contains an intermetallic compound made of Mg and B and also contains one or more metallic elements.

The said intermetallic compound superconductor is characterized in that it has a composition represented by chemical composition formula: $Mg_1B_2$ and having a hexagonal $AlB_2$ type crystallographic structure in which a Mg layer and a B layer alternately lie.

Also, the said alloy superconductor that contains an intermetallic compound made of Mg and B is characterized in that it is an alloy having a composition represented by composition formula: $Mg_{1-x}B_{2+y}$ where $0<x<1$, $-2<y<0$ and $0<y<2$.

The intermetallic compound superconductor made up as mentioned above has a superconducting transition temperature ($T_c$) of 39 K, and is higher in superconducting transition temperature than any intermetallic compound superconductor so far known and indeed much higher in superconducting transition temperature than any known intermetallic compound superconductor having the $AlB_2$ type crystallographic structure.

Also, the alloy superconductor made up as mentioned above has a superconducting transition temperature ($T_c$) of 39 K, and is higher in superconducting transition temperature than any alloy superconductor so far known and comes also higher in both malleability and ductility.

The intermetallic compound superconductor made of magnesium and boron as mentioned above can be used as a superconductor high in superconducting transition temperature ($T_c$) in superconducting electronics such as a high performance Josephson device and a high frequency or electronic device.

The alloy superconductor containing the intermetallic compound made up of magnesium and boron as mentioned above can be used as a superconductor high in superconducting transition temperature and also excellent in malleability and ductility for a superconducting electric wire or cable used in a superconducting electric powder transmission system, a superconducting electric powder storage system or the like and also in a superconducting electronic component such as a high performance Josephson device and a high frequency or electronic device.

The present invention further provides a method of making an intermetallic compound superconductor, which method is characterized in that it comprises the steps of: mixing a Mg containing powder and a B containing powder together to form a mixture powder thereof so that the mixture powder contains Mg and B at a compositional ratio of Mg/B=1/2, shaping the said mixture powder into the form of a pellet, and heating the said pellet in an inert gas to form the intermetallic compound superconductor.

An alternative method of manufacture of an intermetallic compound superconductor in accordance with the present invention may comprise the steps of: mixing a Mg containing powder and a B containing powder together to form a mixture powder thereof so that the mixture powder contains Mg and B at a compositional ratio of Mg/B=1/2, shaping the said mixture powder into the form of a pellet, and heating the said pellet in a vacuum to form the intermetallic compound superconductor.

An alternative method of manufacture of an intermetallic compound superconductor in accordance with the present invention may comprise the steps of: mixing a Mg containing powder and a B containing powder together to form a mixture powder thereof so that the mixture powder contains Mg and B at a compositional ratio of Mg/B=1/2, shaping the said mixture powder into the form of a pellet, and heating the said pellet in a pressurized inert gas to form the intermetallic compound superconductor.

An alternative method of manufacture of an intermetallic compound superconductor in accordance with the present invention may comprise the steps of: mixing a Mg containing powder and a B containing powder together to form a mixture powder thereof so that the mixture powder contains Mg and B at a compositional ratio of Mg/B=1/2, shaping the said mixture powder into the form of a pellet, and pressing and heating or hot-pressing the said pellet to form the intermetallic compound superconductor.

The present invention also provides a method of making an alloy superconductor, characterized in that it comprises the steps of: mixing a Mg containing powder and a B containing powder together to form a mixture powder thereof so that the mixture powder contains Mg and B at a compositional ratio of Mg/B=(1−x)/(2+y) where 0<x<1, −2<y<0 and 0<y<2, shaping the said mixture powder into the form of a pellet, and heating the said pellet in an inert gas to form the alloy superconductor.

An alternative method of manufacture of an alloy superconductor in accordance with the present invention may comprise the steps of: mixing a Mg containing powder and a B containing powder together to form a mixture powder thereof so that the mixture powder contains Mg and B at a compositional ratio of Mg/B=(1−x)/(2+y) where 0<x<1, −2<y<0 and 0<y<2, shaping the said mixture powder into the form of a pellet, and heating the said pellet in a vacuum to form the alloy superconductor.

An alternative method of manufacture of an alloy superconductor in accordance with the present invention may comprise the steps of: mixing a Mg containing powder and a B containing powder together to form a mixture powder thereof so that the mixture powder contains Mg and B at a compositional ratio of Mg/B=(1−x)/(2+y) where 0<x<1, −2<y<0 and 0<y<2, shaping the said mixture powder into the form of a pellet, and heating the said pellet in a pressurized inert gas to form the alloy superconductor.

An alternative method of manufacture of an alloy superconductor in accordance with the present invention may comprise the steps of: mixing a Mg containing powder and a B containing powder together to form a mixture powder thereof so that the mixture powder contains Mg and B at a compositional ratio of Mg/B=(1−x)/(2+y) where 0<x<1, −2<y<0 and 0<y<2, shaping the said mixture powder into the form of a pellet, and pressing and heating or hot pressing the said pellet to form the alloy superconductor.

In the method of manufacture of an intermetallic compound superconductor mentioned above, the said pellet is preferably heated in the said inert gas at a temperature of 700 to 2000° C. for a period of several seconds or more.

In the method of manufacture of an intermetallic compound superconductor mentioned above, the said pellet is preferably heated in the vacuum under a pressure of $2\times10^{-2}$ Pa or less at a temperature of 650 to 1100° C. for a period of several minutes or more.

In the method of manufacture of an intermetallic compound superconductor mentioned above, the said pellet is also preferably heated in the said inert gas under a pressure of 1 to 200 MPa at a temperature of 600 to 1100° C. for a period of several minutes or more.

In the method of manufacture of an intermetallic compound superconductor mentioned above, the said pellet is also preferably pressed and heated or hot pressed under a pressure of 0.1 to 6 GPa at a temperature of 700 to 1400° C. for a period of several minutes or more.

In the method of manufacture of an alloy superconductor mentioned above, the said pellet is advantageously heated in the said inert gas at a temperature of 700 to 2000° C. for a period of several seconds or more.

In the method of manufacture of an alloy superconductor mentioned above, the said pellet is advantageously heated in the vacuum under a pressure of $2\times10^{-2}$ Pa or less at a temperature of 650 to 1100° C. for a period of several minutes or more.

In the method of manufacture of an alloy superconductor mentioned above, the said pellet is advantageously heated in the said inert gas under a pressure of 1 to 200 MPa at a temperature of 600 to 1100° C. for a period of several minutes or more.

In the method of manufacture of an alloy superconductor mentioned above, the said pellet is advantageously pressed and heated or hot pressed under a pressure of 0.1 to 6 GPa at a temperature of 700 to 1400° C. for a period of several minutes or more.

The method of making an intermetallic compound superconductor mentioned above permits an intermetallic compound superconductor composed of magnesium (Mg) and boron (B) in accordance with the present invention to be manufactured reproducibly and easily.

The method of making an alloy superconductor mentioned above permits an alloy superconductor containing the above-mentioned intermetallic compound in accordance with the present invention to be manufactured reproducibly and easily.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof. In the drawings:

FIG. 4 is a table listing atomic coordinates derived of Mg and B in a unit cell from the powder X-ray diffraction measurement pattern;

BEST MODES FOR CARRYING OUT THE INVENTION

Figure 1:
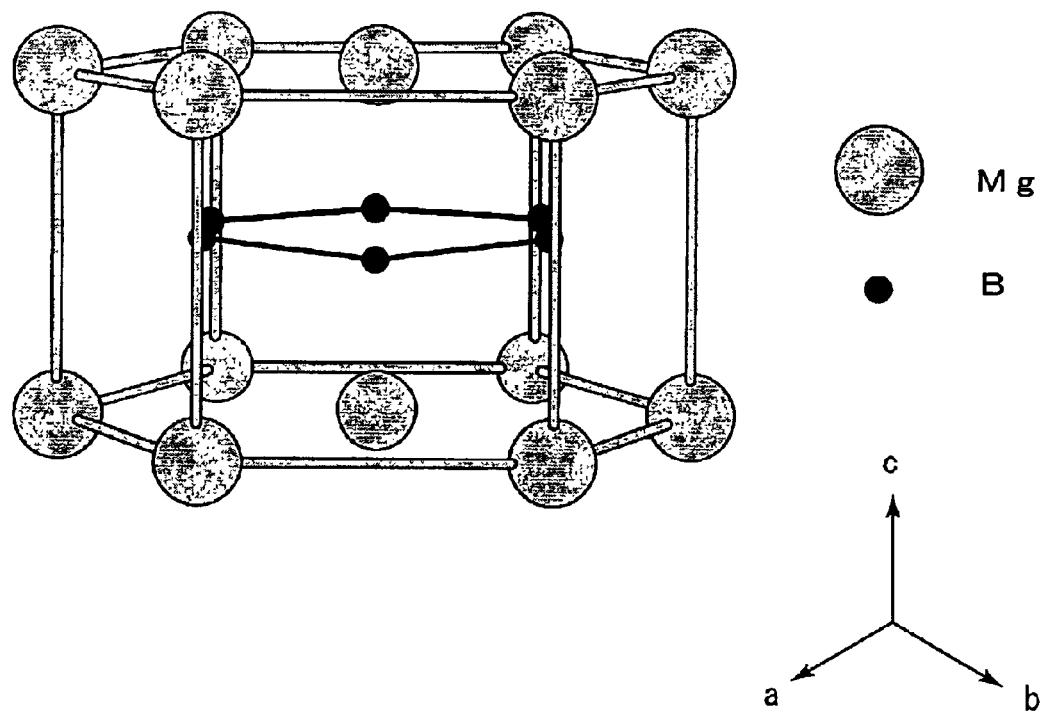
FIG. 1 is a diagram illustrating the crystallographic structure of an intermetallic compound superconductor made of magnesium and boron in accordance with the present invention.

Hereinafter, the present invention will be described in detail with reference to suitable forms of embodiment thereof illustrated in the drawing figures.

Mention is first made of the crystallographic structure of an intermetallic compound made of magnesium and boron according to the present invention.

Figure 2:
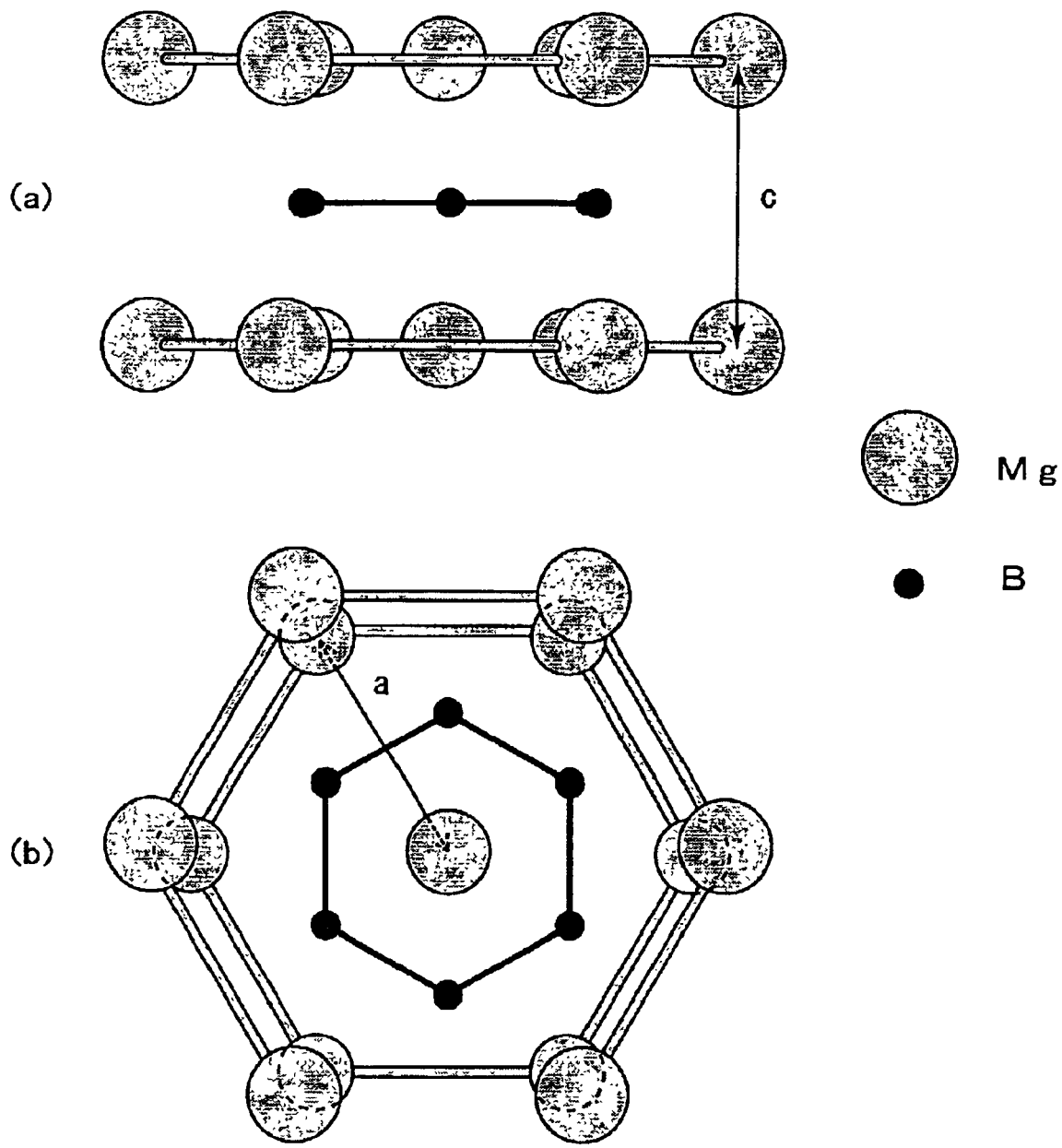
FIGS. 2(a) and 2(b) are a side and a plan view, respectively, of the crystallographic structure of the intermetallic compound made of magnesium and boron in accordance with the present invention.

FIG. 1 is a diagram illustrating the crystallographic structure of an intermetallic compound made of magnesium and boron in accordance with the present invention. FIGS. 2(a) and 2(b) are a side and a plan view, respectively, of the crystallographic structure in some more details As shown in FIGS. 1 and 2, an intermetallic compound according to the present invention is expressed by chemical composition formula: $Mg_1B_2$ and has a hexagonal $AlB_2$ type crystallographic structure.

Figure 3:
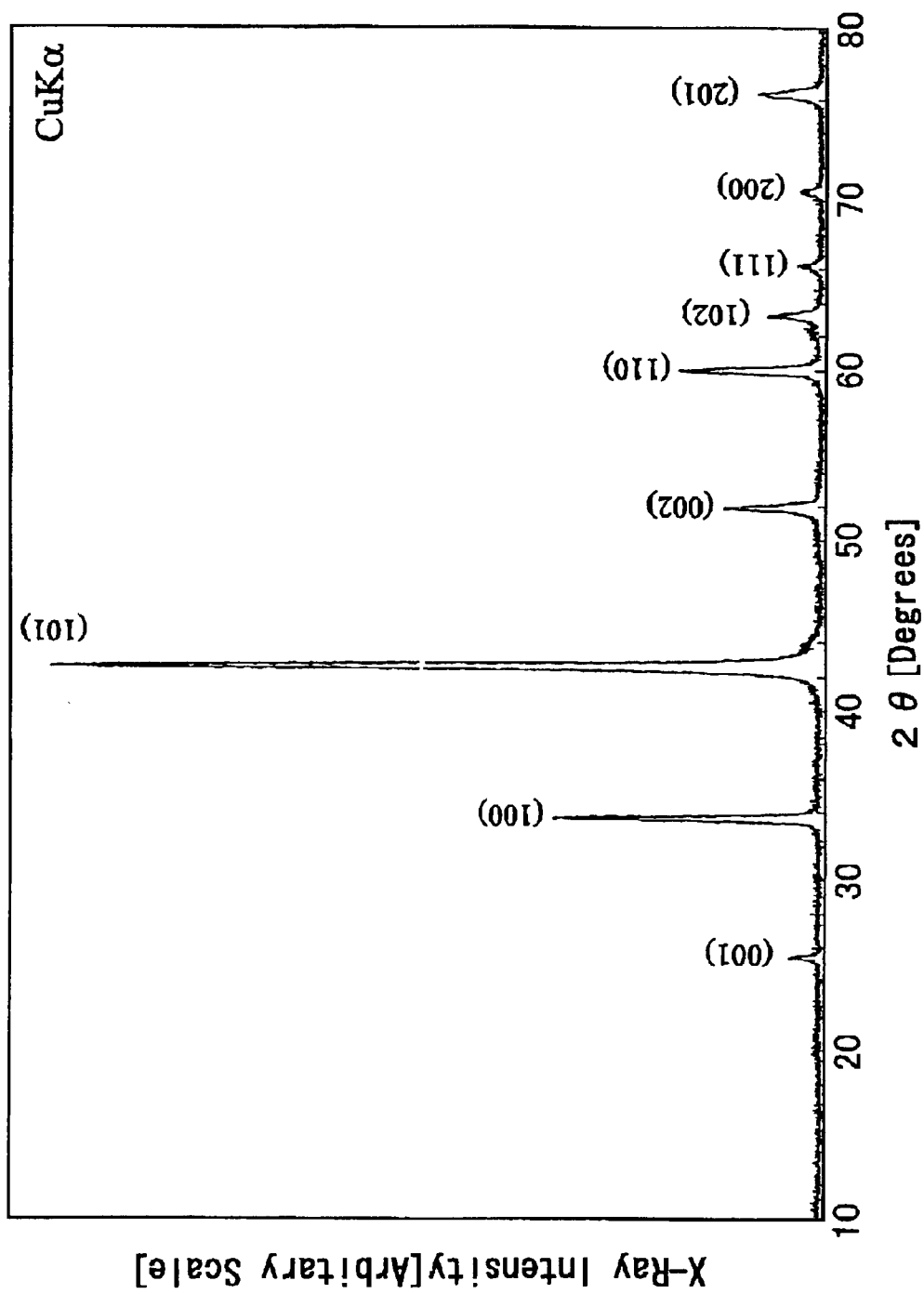
FIG. 3 is a graph illustrating a result of powder X-ray diffraction measurements conducted of the intermetallic compound superconductor according to the present invention.

FIG. 3 is a graph illustrating a result of powder X-ray diffraction measurements conducted of an intermetallic compound of the present invention made by a method of manufacture to be described later herein. The X-ray diffraction measurements were conducted using a biaxial X-ray diffraction analyzer (made by company RIGAKU, model RINT2000).

From the powder X-ray diffraction measurement pattern shown in FIG. 3, it is seen that the crystal system is hexagonal and belongs to the space group p6/mmm. It is also seen that its a- and b-axis have a length of 3.083 angstroms and its c-axis has a length of 3.527 angstroms.

FIG. 4 is a table listing atomic coordinates derived of Mg and B in a unit cell from this powder X-ray diffraction measurement pattern. As is apparent from FIG. 4, it is seen that a B atom is positioned at a center of three closest arrayed Mg atoms in a-b planes and also at a center of adjacent arrays of Mg atoms in the direction of c-axis.

As is apparent from FIGS. 3 and 4, the intermetallic compound superconductor according to the present invention has the hexagonal $AlB_2$ type crystallographic structure shown in FIGS. 1 and 2.

Mention is next made of the superconducting characteristics of the intermetallic compound superconductor made of magnesium and boron in accordance with the present invention.

Figure 5:
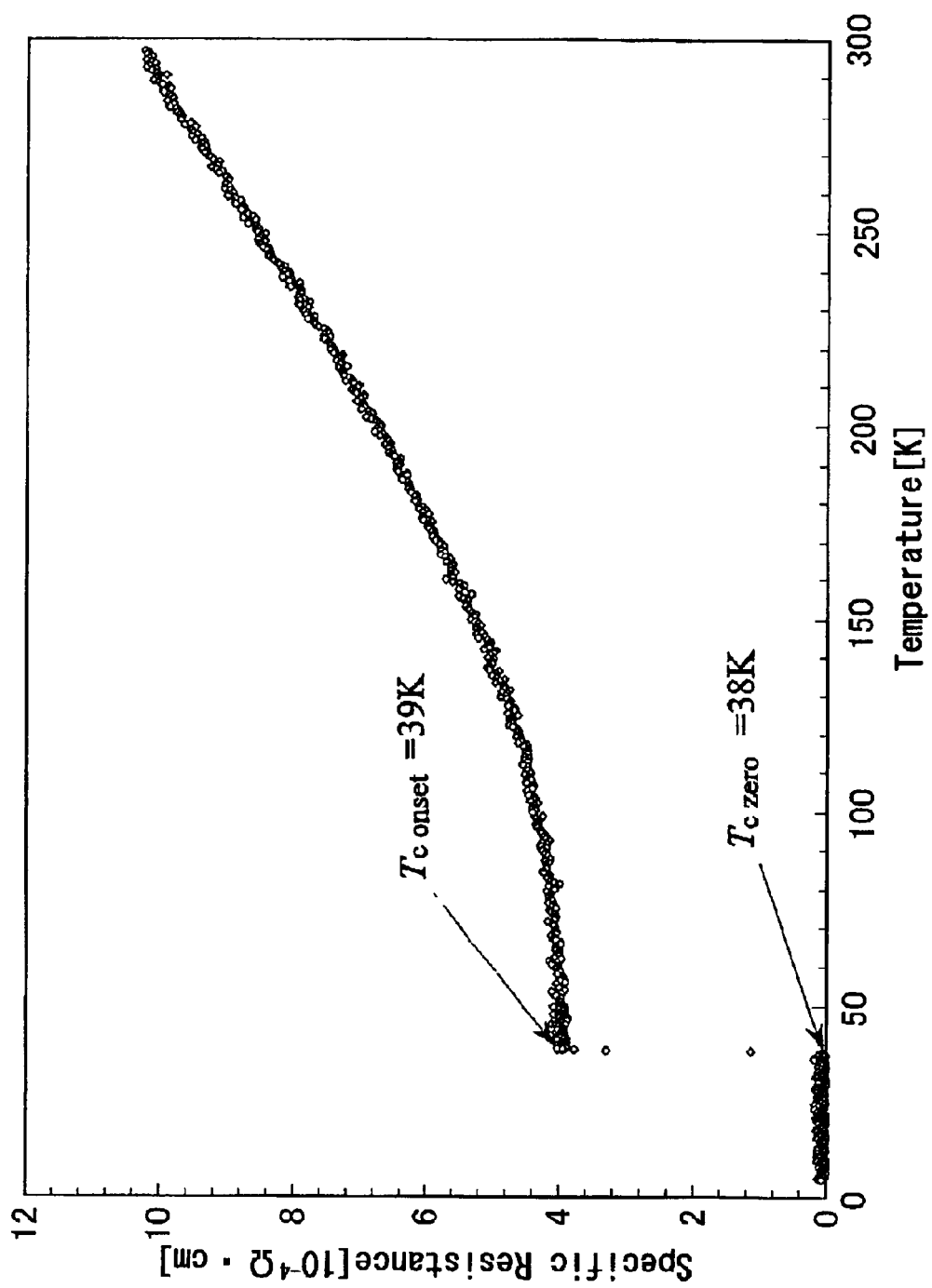
FIG. 5 is a graph illustrating a result of measurements conducted to derive the temperature characteristics of the resistance of the intermetallic compound semiconductor made of magnesium and boron in accordance with the present invention.

FIG. 5 is a graph illustrating a result of measurements conducted to derive the temperature characteristics of the resistance of the intermetallic compound semiconductor made of magnesium and boron in accordance with the present invention. The electrical resistance was measured according to the 4-probe method.

From FIG. 5, it is seen that the electrical resistance decreases with the temperature decreased, and sharply becomes zero at a temperature of 39 K, which indicates that the intermetallic compound has a superconducting transition temperature of 39 K.

While the superconducting transition temperature is usually defined in terms of both $T_c$onset and $T_c$zero, the intermetallic compound superconductor according to the present invention has $T_c$onset=39 K and $T_c$zero=38 K.

Mention is next made of a result of measurements of the magnetic susceptibility of the intermetallic compound according to the present invention.

Figure 6:
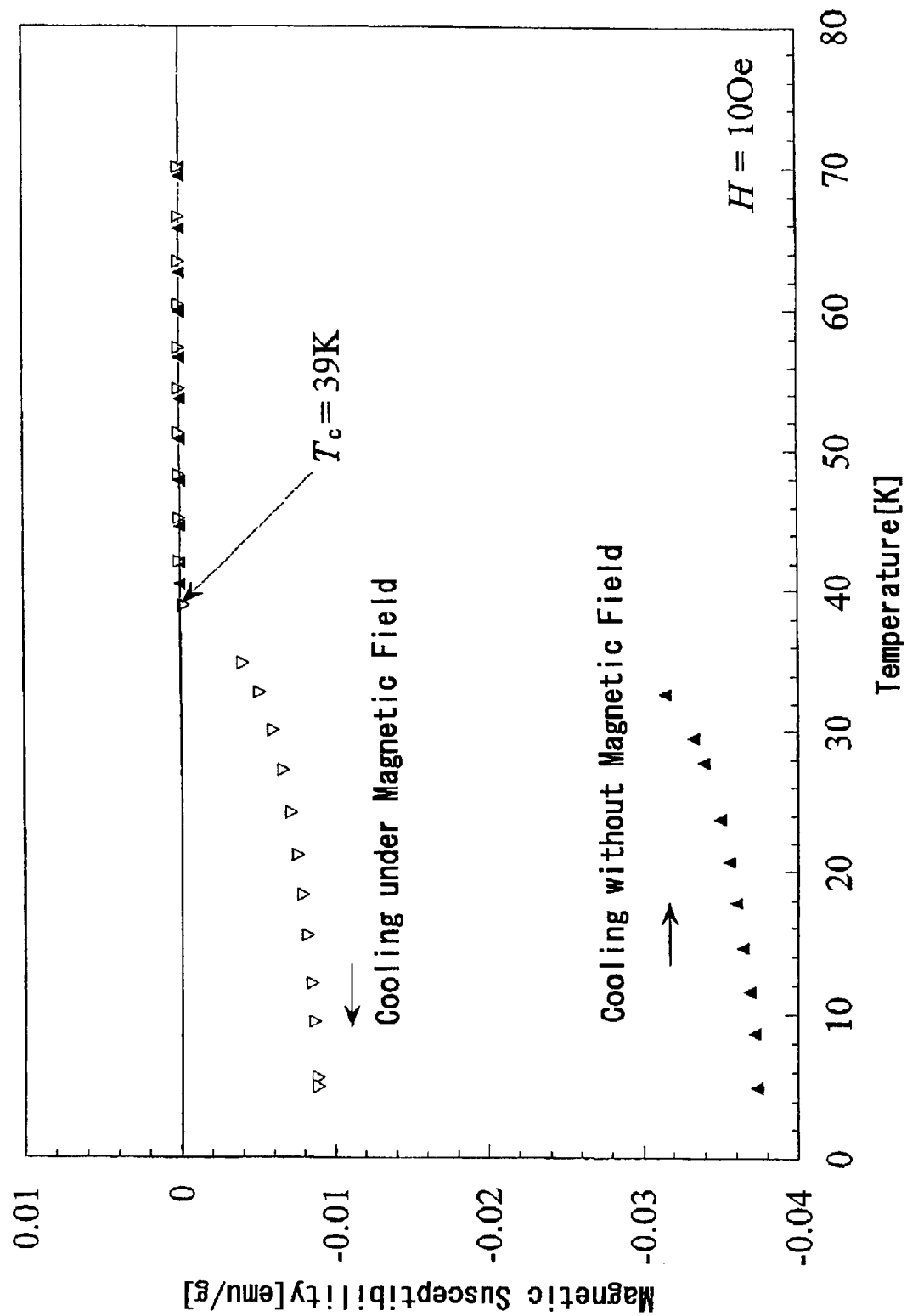
FIG. 6 is a graph illustrating a result of measurements conducted to derive the temperature characteristics of the magnetic susceptibility of the intermetallic compound made of magnesium and boron in accordance with the present invention.

FIG. 6 is a graph illustrating a result of measurements conducted to derive the temperature characteristics of the magnetic susceptibility of the intermetallic compound made of magnesium and boron in accordance with the present invention. The magnetic susceptibilities were measured using a DC susceptometer or DC susceptibility measurement apparatus (made by company Quantum Design, MPMS Series, Model MPMS-R2).

As is apparent from FIG. 6, exhibiting negative susceptibilities, namely diamagnetism, at temperatures lower than $T_c$=39 K it is seen that the intermetallic compound superconductor made of magnesium and boron in accordance with the present invention is a superconductor having a superconducting transition temperature of $T_c$=39 K.

In FIG. 6, the case is shown that cooling is effected under a magnetic field H (=100 Oersted). Showing lower susceptibilities in cooling under a magnetic field indicate that it is due to the presence of a penetrating magnetic flux and hence that the superconductor is a class 2 superconductor.

Mention is next made of an alloy superconductor containing the intermetallic compound made of magnesium and boron in accordance with the present invention.

Figure 7:
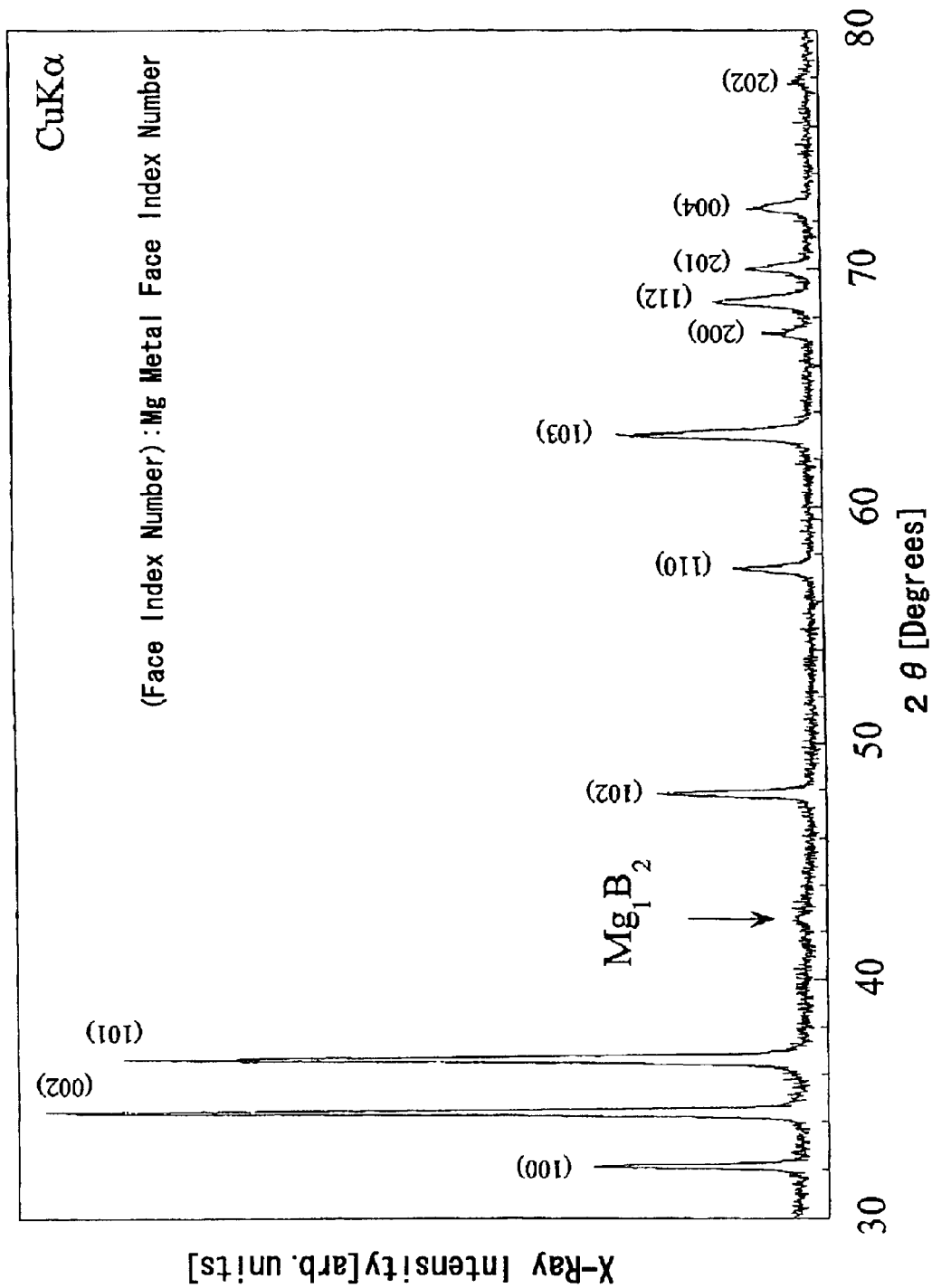
FIG. 7 is a graph illustrating a result of powder X-ray diffraction measurements conducted of an alloy superconductor containing the intermetallic compound made of magnesium and boron in accordance with the present invention.

FIG. 7 is a graph illustrating a result of powder X-ray diffraction measurements conducted of an alloy superconductor containing the intermetallic compound made of magnesium and boron in accordance with the present invention. The alloy superconductor used in the measurements is one made by a method of manufacture to be described later herein and has a composition $Mg_1B_{0.33}$, and the method of measurement is identical to that for the case of FIG. 3.

In FIG. 7, the diffraction peaks are seen all to agree with the face index numbers of Mg metal atoms (having hexagonal closest packed crystal structure), and at the angular position of diffraction indicated by the arrow there is observed, though small, an intensity of diffraction based on the $Mg_1B_2$ intermetallic compound. It is thus seen that an alloy superconductor according to the present invention is an alloy superconductor containing the intermetallic compound made of magnesium and boron.

Mention is next made of the superconducting properties of an alloy superconductor containing the intermetallic compound made of magnesium and boron.

Figure 8:
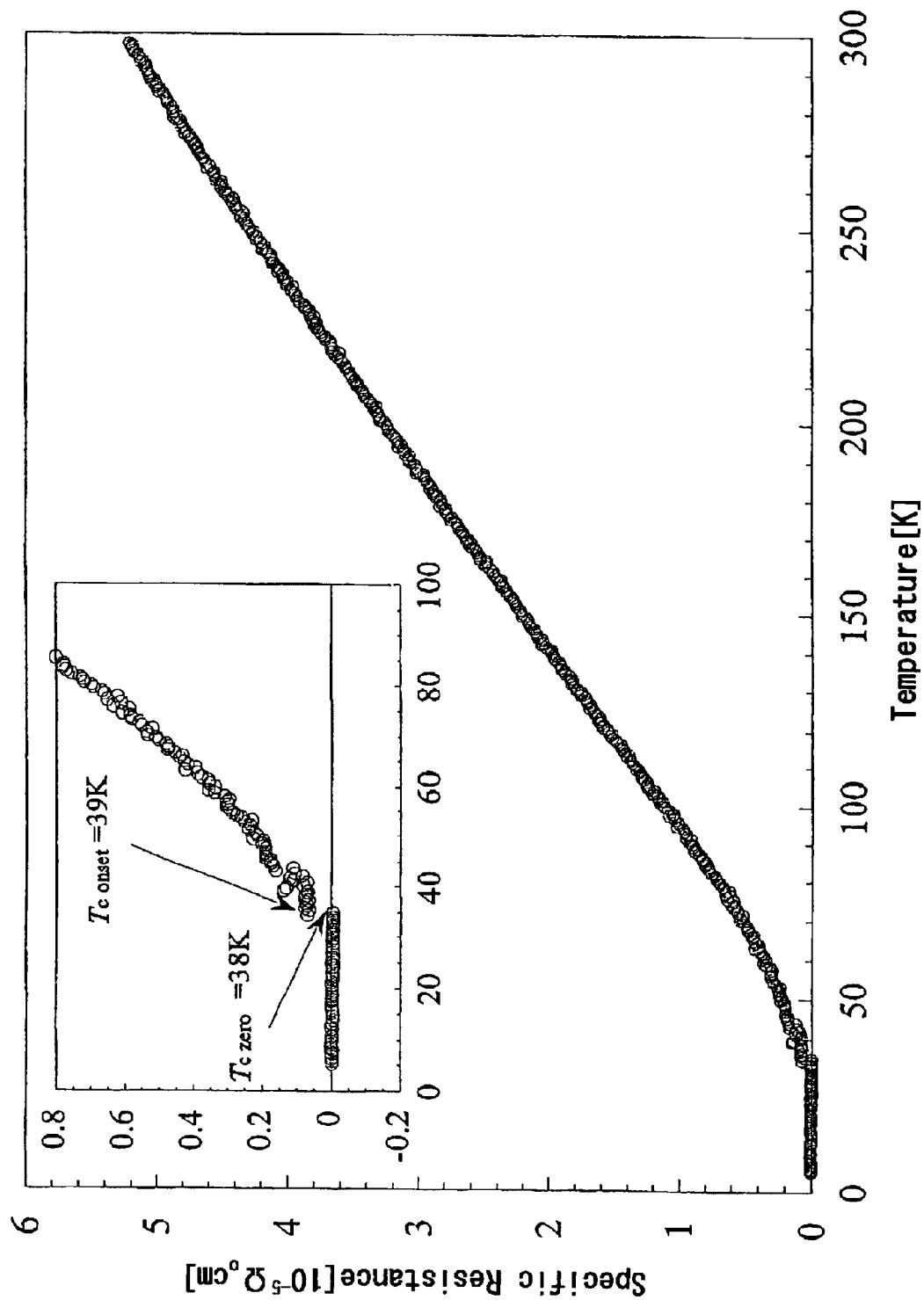
FIG. 8 is a graph illustrating a result of measurements conducted to derive the temperature characteristics of the resistance of the alloy superconductor containing the intermetallic compound made of magnesium and boron in accordance with the present invention.

FIG. 8 is a graph illustrating a result of measurements conducted to derive the temperature characteristics of the resistance of an alloy superconductor containing the intermetallic compound made of magnesium and boron in accordance with the present invention. FIG. 8 in addition to the main includes a subsidiary graph showing the characteristics in the neighborhood of the superconducting transition temperature in a magnified scale. As is apparent from FIG. 8, the alloy superconductor containing the intermetallic compound made of magnesium and boron in accordance with the present invention is a superconductor having a superconducting transition temperature: $T_c$=39 K.

Mention is next made of a result of measurements conducted of the magnetic susceptibility of alloy superconductor according to the present invention.

Figure 9:
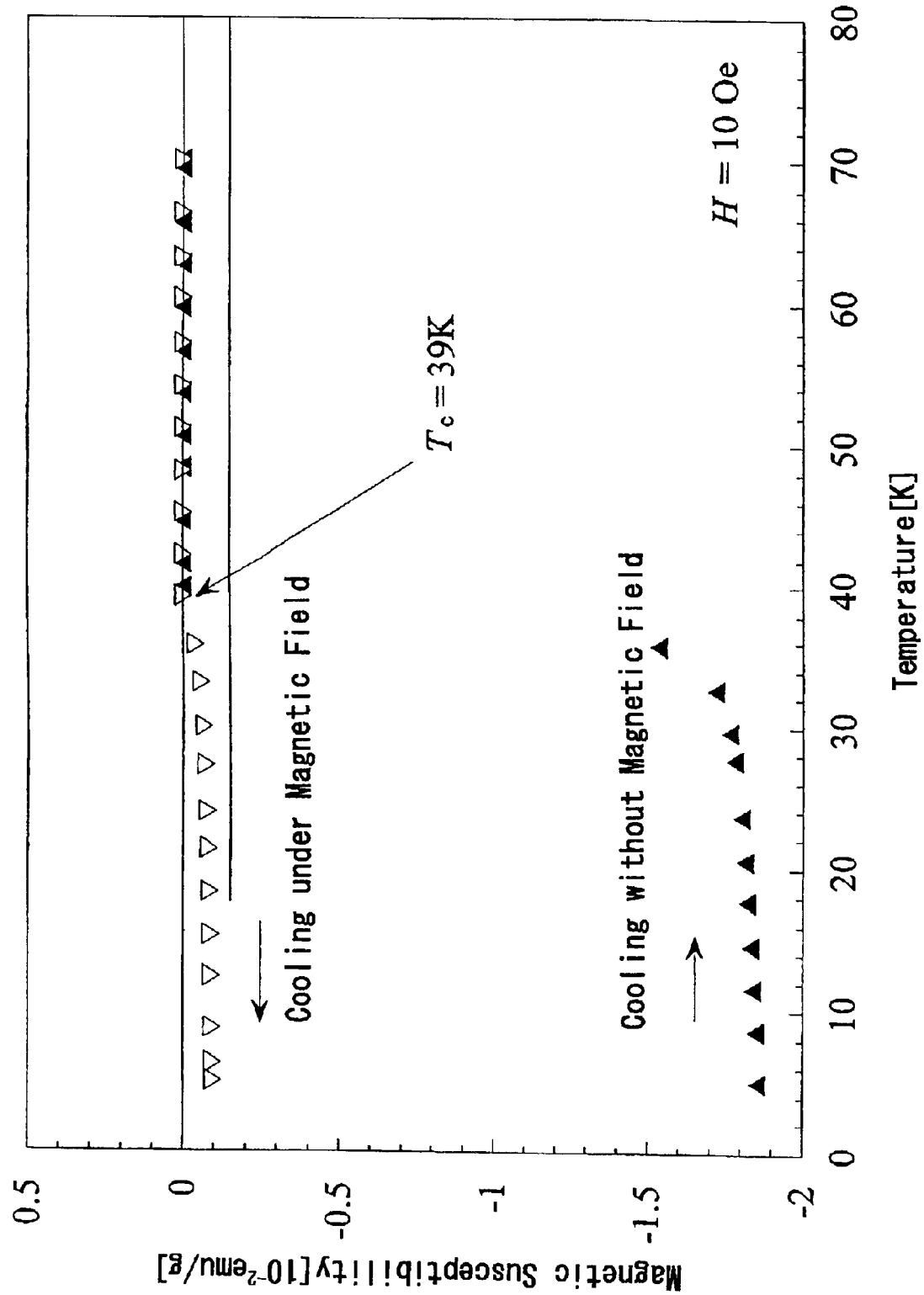
FIG. 9 is a graph illustrating a result of measurements conducted to derive the temperature characteristics of the magnetic susceptibility of the alloy superconductor containing the intermetallic compound made of magnesium and boron in accordance with the present invention.

FIG. 9 is a graph illustrating a result of measurements conducted to derive the temperature characteristics of the magnetic susceptibility of an alloy superconductor containing the intermetallic compound made of magnesium and boron in accordance with the present invention. Magnetic susceptibilities were measured in the same manner as in the measurements of FIG. 6.

As is apparent from FIG. 9, exhibiting negative susceptibilities, namely diamagnetism, at temperatures lower than $T_c$=39 K it is seen that the alloy superconductor containing the intermetallic compound made of magnesium and boron in accordance with the present invention is a superconductor having a superconducting transition temperature of $T_c$=39 K. In FIG. 9, the case is shown that cooling is effected under a magnetic field H (=100 Oersted). Showing lower susceptibilities in cooling under a magnetic field indicate that it is due to the presence of a penetrating magnetic flux and hence that the superconductor is a class 2 superconductor.

Mention is next made of methods of making an intermetallic compound superconductor made of magnesium and boron, and alloy superconductor containing the intermetallic compound made of magnesium and boron, in accordance with the present invention.

In the methods of making according to the present invention to be described below, which of intermetallic compound superconductor and alloy superconductor is coming out depends on the compositional proportions of Mg and B in feedstock powders to be mixed together. Thus, if feedstock powders are mixed together to contain magnesium and boron at a compositional ratio of Mg/B=1/2, then the entire powder mixture makes up a single phase intermetallic compound superconductor of the hexagonal $AlB_2$ type crystallographic structure expressed by composition formula: $Mg_1B_2$ On the other hand, if feedstock powders are mixed together to contain magnesium and boron at a compositional ratio of $Mg/B=(1-x)/(2+y)$ where $0<x<1$, $-2<y<0$ and $0<y<2$, then there comes out an alloy superconductor containing the intermetallic compound mentioned above. Here, the compositional ratio can be varied to meet with an application purpose. For example, making Mg larger in compositional proportion may produce a superconducting electric cable. For Mg feedstock powder, use may be made of Mg powder or MgO powder. And, for B feedstock powder, use may be made of B powder.

In making an intermetallic compound superconductor or a powder conductor, several methods are available.

In a first method, a Mg powder and a B powder are mixed together in an agitating apparatus to form a powder mixture, which is then shaped into a pellet form, which in turn is heated in an inert gas atmosphere at a temperature of 700 to 2000° C. for a period of several seconds or more by using any known heating means such as arc heating, plasma-arc heating or high-frequency melting. This method permits forming either superconductor with ease.

In a second method, a Mg powder and a B powder are mixed together in the agitating apparatus to form a powder mixture, which is then shaped into a pellet form, which in turn is heated in a vacuum under a pressure of $2\times10^{-2}$ Pa or less at a temperature of 650 to 1100° C. for a period of several minutes or more. This method permits forming either superconductor with ease.

In a third method, a Mg powder and a B powder are mixed together in the agitating apparatus to form a powder mixture, which is then shaped into a pellet form, which in turn is placed in a HIP (hot isostatic pressing) apparatus (made by, e.g., company Kobe Seiko, high temperature, high pressure atmosphere furnace) charged with an inert gas and is heated therein under an inert gas pressure of 1 to 200 MPa at a temperature of 600 to 1100° C. for a period of several minutes or more. This method permits forming either superconductor with ease.

In a fourth method, Mg powder and B powder are mixed together in the agitating apparatus to form a powder mixture, which is then shaped into a pellet form, which in turn is placed in a cubic anvil pressing or like pressing apparatus and is heated therein under a pressure of 0.1 to 6 GPa at a temperature of 700 to 1400° C. (hot pressed) for a period of several minutes or more. This method permits forming either superconductor with ease. High pressure is required to facilitate joining grain boundaries together while high temperature is needed to grow superconducting phase.

It should be noted here that an intermetallic compound superconductor and an alloy superconductor according to the present invention are not limited in form to a polycrystalline sintered body as above but may in form be a polycrystalline bulk body, large single crystal, or a thin film.

Using a conventional bulk body fabricating apparatus such as a forging or a superhigh-pressure pressing and heating synthetic apparatus permits an intermetallic compound superconductor in the form of a polycrystalline bulk body to be made that is light in weight, high in hardness and excels in corrosion resistance.

Also, a large single-crystal intermetallic compound superconductor is obtainable by using a known single-crystal growth process such as recrystallization, simple lifting, floating zone melting or fluxing, with the use of a suitable crucible in a controlled atmosphere.

Further, a thin-film intermetallic compound superconductor is obtainable by chemical gas-phase vapor deposition using a gas phase source containing magnesium and boron at compositional ratio of Mg/B=1/2, or by sputtering with the use of a target material as a sputtering source containing magnesium and boron at compositional ratio of Mg/B=1/2. Also, for the substrate on which to form a thin-film intermetallic compound superconductor, use may be a metal substrate formed of, e,g., Cu, or a ceramic substrate, and may be a composite substrate having a ceramic deposited on a metal substrate. Such substrates may selectively be used to meet with a particular use or application.

A superconducting alloy that excels in malleability and ductility is obtainable by making larger in Mg and B proportions the amount of Mg that excels in malleability and ductility, or by compounding upon addition of another metal or metals that excels in malleability and ductility. Such a superconducting alloy can be worked by rolling or extrusion into a ultra-thin multi-core superconducting cable, a thin superconducting wire, or a superconducting alloy wire or cable.

INDUSTRIAL APPLICABILITY

As can be appreciated from the foregoing description, the present invention provides an intermetallic compound superconductor that is high in superconducting transition temperature and is easy to make and hence is extremely useful when applied to superconducting electronics such as a high performance Josephson device, a high frequency or electronic device.

The present invention also provides an alloy superconductor containing the intermetallic compound, which is high in superconducting transition temperature, excels in malleability and ductility and is easy to make, and hence is extremely useful when applied to a large scale superconducting cable system, a superconducting electric power storage system, a high performance Josephson device, a high frequency or electronic device.

Further, using the method of making an intermetallic compound superconductor or an alloy superconductor containing such an intermetallic compound permits the intermetallic superconductor or the alloy superconductor containing such an intermetallic compound to be manufactured with an extremely high reproducibility, with ease, and at a reasonable cost.

What is claimed is:

1. A method of conducting electrical current, comprising the steps of:

providing an intermetallic compound superconductor of a composition expressed by chemical composition formula: $Mg_1B_2$ and having a hexagonal $AlB_2$ type crystallographic structure in which a Mg layer and a B layer lie alternately; and bringing said compound superconductor to a temperature of 39 K or lower, and passing electrical current through said compound superconductor.

2. A method of conducting electrical current, comprising the steps of: forming an intermetallic compound superconductor by the steps of:

mixing a Mg containing feedstock powder and a B containing feedstock powder together to form a mixture powder thereof so that the mixture powder contains Mg and B at a compositional ratio of Mg/B=1/2, shaping said mixture powder into the form of a pellet, and heating said pellet in an inert gas to form the intermetallic compound superconductor; bringing said intermetallic compound superconductor to a temperature of 39 K or lower; and passing electrical current through said intermetallic compound superconductor.

3. A method of conducting electrical current as set forth in claim 2, wherein said heating step is conducted at a temperature of 700 to 2000° C. for a period of several seconds or more.

4. A method of conducting electrical current, comprising the steps of: forming an intermetallic compound superconductor by the steps of:

mixing a Mg containing feedstock powder and a B containing feedstock powder together to form a mixture powder thereof so that the mixture powder contains Mg and B at a compositional ratio of Mg/B=1/2, shaping said mixture powder into the form of a pellet, and heating said pellet in a vacuum to form the intermetallic compound superconductor; bringing said intermetallic compound superconductor to a temperature of 39 K or lower; and passing electrical current through said intermetallic compound superconductor.

5. A method of conducting electrical current as set forth in claim 4, wherein said heating step is conducted under a pressure of $2 \times 10^{-2}$ Pa or less at a temperature of 650 to 1100° C. for a period of several minutes or more.

6. A method of conducting electrical current, comprising the steps of: forming an intermetallic compound superconductor by the steps of:

mixing a Mg containing feedstock powder and a B containing feedstock powder together to form a mixture powder thereof so that the mixture powder contains Mg and B at a compositional ratio of Mg/B=1/2, shaping said mixture powder into the form of a pellet, and heating said pellet in a pressurized inert gas to form the intermetallic compound superconductor; bringing said intermetallic compound superconductor to a temperature of 39 K or lower; and passing electrical current through said intermetallic compound superconductor.

7. A method of conducting electrical current as set forth in claim 6, wherein said heating step is conducted under a pressure of 1 to 200 MPa at a temperature of 600 to 1100° C. for a period of several minutes or more.

8. A method of conducting electrical current, comprising the steps of: forming an intermetallic compound superconductor by the steps of:

mixing a Mg containing feedstock powder and a B containing feedstock powder together to form a mixture powder thereof so that the mixture powder contains Mg and B at a compositional ratio of Mg/B=1/2, shaping said mixture powder into the form of a pellet, and pressing and heating said pellet to form the intermetallic compound superconductor; bringing said intermetallic compound superconductor to a temperature of 39 K or lower, and passing electrical current through said intermetallic compound superconductor.

9. A method of conducting electrical current as set forth in claim 8, wherein said pressing and heating step is conducted under a pressure of 0.1 to 6 GPa at a temperature of 700 to 1400° C. for a period of several minutes or more.

* * * * *